(12) United States Patent
Bandoh et al.

(10) Patent No.: US 6,594,889 B1
(45) Date of Patent: Jul. 22, 2003

(54) METHOD FOR PROCESSING LEADFRAME

(75) Inventors: Kazuhiko Bandoh, Kyoto (JP); Michio Osada, Kyoto (JP); Tsuyoshi Amakawa, Kyoto (JP); Yoshihiko Kojima, Kyoto (JP); Fumio Takashima, Kyoto (JP); Kouichi Kawamura, Kyoto (JP)

(73) Assignee: Towa Corporation, Kyoto (JP)

( * ) Notice: Subject to any disclaimer, the term of this patent is extended or adjusted under 35 U.S.C. 154(b) by 0 days.

(21) Appl. No.: 09/436,315

(22) Filed: Nov. 8, 1999

(30) Foreign Application Priority Data

Dec. 1, 1998 (JP) .......................... 10-340876

(51) Int. Cl.⁷ .................... H01R 43/00; B21D 43/02
(52) U.S. Cl. .................. 29/827; 29/742; 29/564.1; 72/421; 72/429; 361/813
(58) Field of Search ................. 29/827, 564.6, 29/759, 564.1, 564.2, 564.3, 564.5, 564.8, 742, 841; 72/421, 429; 361/813

(56) References Cited

U.S. PATENT DOCUMENTS

| | | | | |
|---|---|---|---|---|
| 3,423,516 A | * | 1/1969 | Segerson | 174/52 |
| 3,444,441 A | * | 5/1969 | Helda | 317/234 |
| 3,916,515 A | * | 11/1975 | Walsh | 29/626 |
| 4,054,238 A | * | 10/1977 | Lloyd | 228/173 |
| 4,084,312 A | * | 4/1978 | Kirk | 29/588 |
| 4,100,675 A | * | 7/1978 | Landsittel | 29/627 |
| 4,466,183 A | * | 8/1984 | Burns | 29/827 |
| 4,590,667 A | * | 5/1986 | Simon | 29/589 |
| 4,597,714 A | * | 7/1986 | Morrison | 414/729 |
| 4,624,358 A | * | 11/1986 | Satou | 198/345 |
| 4,627,159 A | * | 12/1986 | Waldner | 29/827 |
| 4,802,512 A | * | 2/1989 | Kodera | 140/149 |
| 4,852,250 A | * | 8/1989 | Andrews | 29/827 |
| 5,163,222 A | * | 11/1992 | Imlig | 29/827 |
| 5,200,202 A |  | 4/1993 | Ahn | |
| 5,307,555 A | * | 5/1994 | Eder | 29/566.3 |
| 5,361,486 A | * | 11/1994 | Harmsen | 29/563 |
| 5,413,471 A | * | 5/1995 | Yamauchi | 425/129.1 |
| 5,501,587 A | * | 3/1996 | Kwak | 425/116 |
| 5,636,430 A | * | 6/1997 | Uchiyama | 29/564.7 |
| 5,639,203 A |  | 6/1997 | Lee | |
| 5,747,764 A | * | 5/1998 | Son | 200/61.86 |
| 6,030,711 A | * | 2/2000 | Evers | 428/458 |

\* cited by examiner

Primary Examiner—A. Dexter Tugbang
(74) Attorney, Agent, or Firm—W. F. Fasse; W. G. Fasse

(57) ABSTRACT

A method of processing a leadframe involves steps of transporting a leadframe to load it into a lead processing unit including plural sets of processing presses; adjusting a press pitch of the processing presses according to a work pitch of workpieces on the leadframe by rotating a nut member that is coupled to at least one of the processing presses and engaged on a non-rotating screw shaft extending in the transport direction of the leadframe, so that the nut member moves along the screw shaft and the respective processing press coupled thereto moves with the nut member; and performing a predetermined lead processing on the leadframe using the processing presses after the step of adjusting the press pitch.

7 Claims, 5 Drawing Sheets

METHOD FOR PROCESSING LEADFRAME

BACKGROUND OF THE INVENTION

1. Field of the Invention

The present invention relates to a method and an apparatus for processing a leadframe on which electronic parts such as ICs are mounted and then molded in resin to seal them. The invention further relates to improvements in a method of processing a leadframe and an apparatus to which this method is applied, the processing referring to cutting of a predetermined portion of the leadframe, cutting of the leadframe to separate works (electronic parts each composing a product) on the leadframe, bending of a predetermined portion of the leadframe, or the like.

2. Description of the Background Art

A leadframe processing apparatus usually includes a leadframe loading unit for supplying, along a leadframe loading transport passage, a leadframe which has not undergone lead processing, a lead processing unit, and a leadframe unloading unit for discharging a leadframe which has undergone lead processing. The lead processing here refers to processes of cutting a leadframe, bending a leadframe, cutting (punching) a leadframe to separate works, i.e. components, therefrom, and the like.

The lead processing unit of the leadframe processing apparatus conventionally includes one press for processing (processing press). A plurality of sets of molds for processing (processing molds) are fixed to the press, the molds each having a punch and a die located at a pitch position corresponding to the pitch or spacing of the works or components on a leadframe. The press thus has a so-called progressive mold structure.

In the lead processing, a leadframe is intermittently supplied step by step to predetermined positions between punches and dies of the molds while cutting and bending processes or the like are performed by using the punches and dies.

A die set including a mold is attached to the conventional processing press. Therefore, if the processing press has a die set including a mold for cutting, it constitutes a lead cutting apparatus. If the processing press has a die set including a mold for bending, it constitutes a lead bending apparatus.

The conventional leadframe processing apparatus has a structure in which a plurality of sets of processing molds are fixed to one processing press. In order to adjust the pitch of the processing molds (punch and die of a die set) according to the pitch of the components or works on a leadframe such that the processing molds are surely attached to the processing press with high precision, a considerable proficiency is required. Such proficiency is also needed because such type of apparatus is an ultraprecision processing apparatus used for small-sized electronic parts.

Specifically, since each processing mold is fixed to one processing press, its processing function for a leadframe is inappropriate if alignment of the mold with the press is inaccurate, resulting in significant disadvantageous effects such as occurrence of defective parts or components.

SUMMARY OF THE INVENTION

One object of the present invention is to provide a method of processing a leadframe by which the pitch of processing presses (pitch of processing molds) as discussed above can readily and surely be adjusted with high precision according to the pitch of works on a leadframe when the leadframe is processed, and provide a processing apparatus to which this method is applied.

A method of processing a leadframe according to the invention which achieves the above object includes the steps of transporting a leadframe to load it to a lead processing unit having a plurality of sets of processing presses, adjusting the pitch of the plurality of processing presses according to the pitch of works or components on the leadframe, and performing a predetermined lead processing on the leadframe by the plurality of sets of processing presses after the step of adjusting the press pitch.

A leadframe processing apparatus according to the invention to implement the leadframe processing method of the invention above includes a leadframe loading unit placed along a loading transport passage of a leadframe for loading a leadframe which has not undergone lead processing, a lead processing unit coupled to the leadframe loading unit and having a plurality of sets of processing presses, a leadframe unloading unit coupled to the lead processing unit for unloading a leadframe which has undergone lead processing, and press pitch adjusting means for freely adjusting pitch of the plurality of sets of processing presses in the direction of the loading transport passage of a leadframe.

According to the method and apparatus for processing a leadframe of the present invention having the structure as described above, the pitch of a plurality of sets of processing presses provided to the lead processing unit is adjusted according to the pitch of works on a leadframe. Accordingly, with no proficiency in operation, the pitch of processing presses can easily and surely be adjusted with high precision according to the pitch of works on a leadframe. As a result, the operation of processing a leadframe can efficiently and surely be performed.

Preferably, in the leadframe processing apparatus of the invention, a fitting portion for a leadframe processing mold is placed at the processing press so as to directly attach the leadframe processing mold to the fitting portion. By such a structure, the leadframe processing mold can easily be attached to the processing press with high precision and the overall size of the leadframe processing apparatus can be decreased to accomplish superior practical effects such as reduction of cost and the like.

According to a preferred embodiment of the leadframe processing apparatus of the present invention, a sucking discharge mechanism for processing wastes is provided to the lead processing unit above and additionally control means is provided for automatically controlling the degree of sucking processing wastes by the sucking discharge mechanism. By this structure, the degree of sucking the processing wastes by the sucking discharge mechanism can automatically be controlled to achieve superior practical effects that the processing wastes in the lead processing unit can always be sucked and discharged appropriately.

According to another preferred embodiment of the leadframe processing apparatus of the invention, the lead processing unit includes a plurality of lead processing main bodies each having at least one processing press, and the plurality of lead processing main bodies are detachably coupled to each other. This structure thus achieves superior practical effects that the number of lead processing main bodies in the lead processing unit can easily and appropriately be adjusted depending on increase or decrease of the number of processing steps.

The means for adjusting the pitch of the presses in the leadframe processing apparatus of the present invention includes, for example, a screw shaft nonrotatably placed in the direction of leadframe loading transportation, a nut member which is engaged with the screw shaft and to which a processing press is coupled, and a driving motor which applies rotational force to the nut member via power transmission means. Using the press pitch adjusting means having the structure above, the pitch of processing presses can readily be adjusted by rotating the nut member with the rotational force applied by the driving motor to shift the nut member in the direction of the screw shaft, and thus simultaneously shifting the processing press coupled to the nut member.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention are hereinafter described in conjunction with the drawings.

Figure 2A:
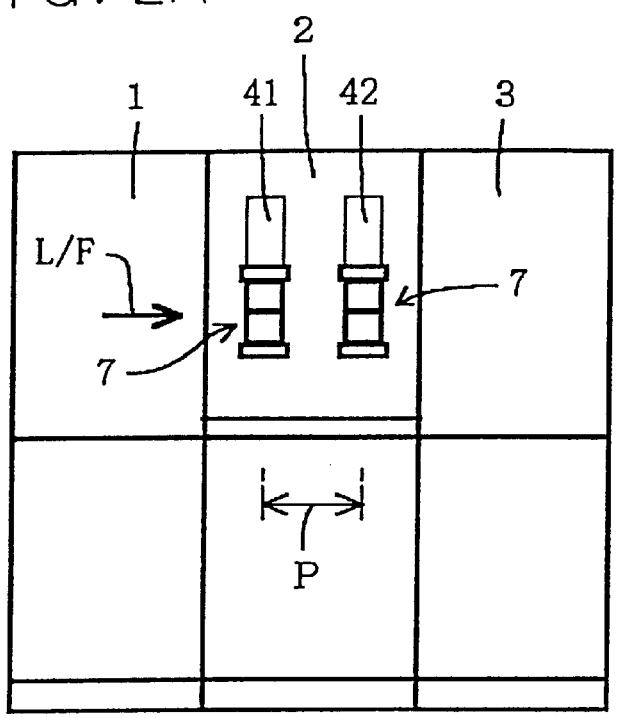
FIG. 2A is a schematic front view of the leadframe processing apparatus shown in FIG. 1
Figure 2B:
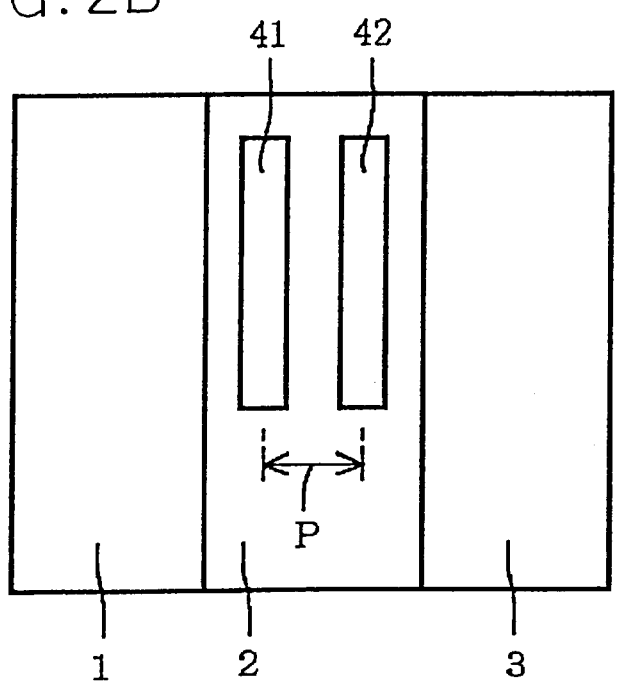
FIG. 2B is a schematic plan view thereof, illustrating two sets of processing presses placed at a lead processing unit.

A leadframe processing apparatus illustrated in FIGS. 2A and 2B is constituted of a leadframe loading unit 1 for supplying, along a loading transport passage of a leadframe (L/F), a leadframe which has not undergone lead processing, a leadframe processing unit 2 coupled to leadframe loading unit 1, and a leadframe unloading unit 3 coupled to lead processing unit 2 for discharging a leadframe which has undergone lead processing.

One lead processing main body having two sets of processing presses 41 and 42 is provided to lead processing unit 2.

In addition, a press pitch adjusting mechanism 5 (see FIG. 1) is provided for automatically and freely adjusting a press pitch P between the two sets of processing presses 41 and 42 in the direction of the leadframe (L/F) loading transport passage.

Figure 1:
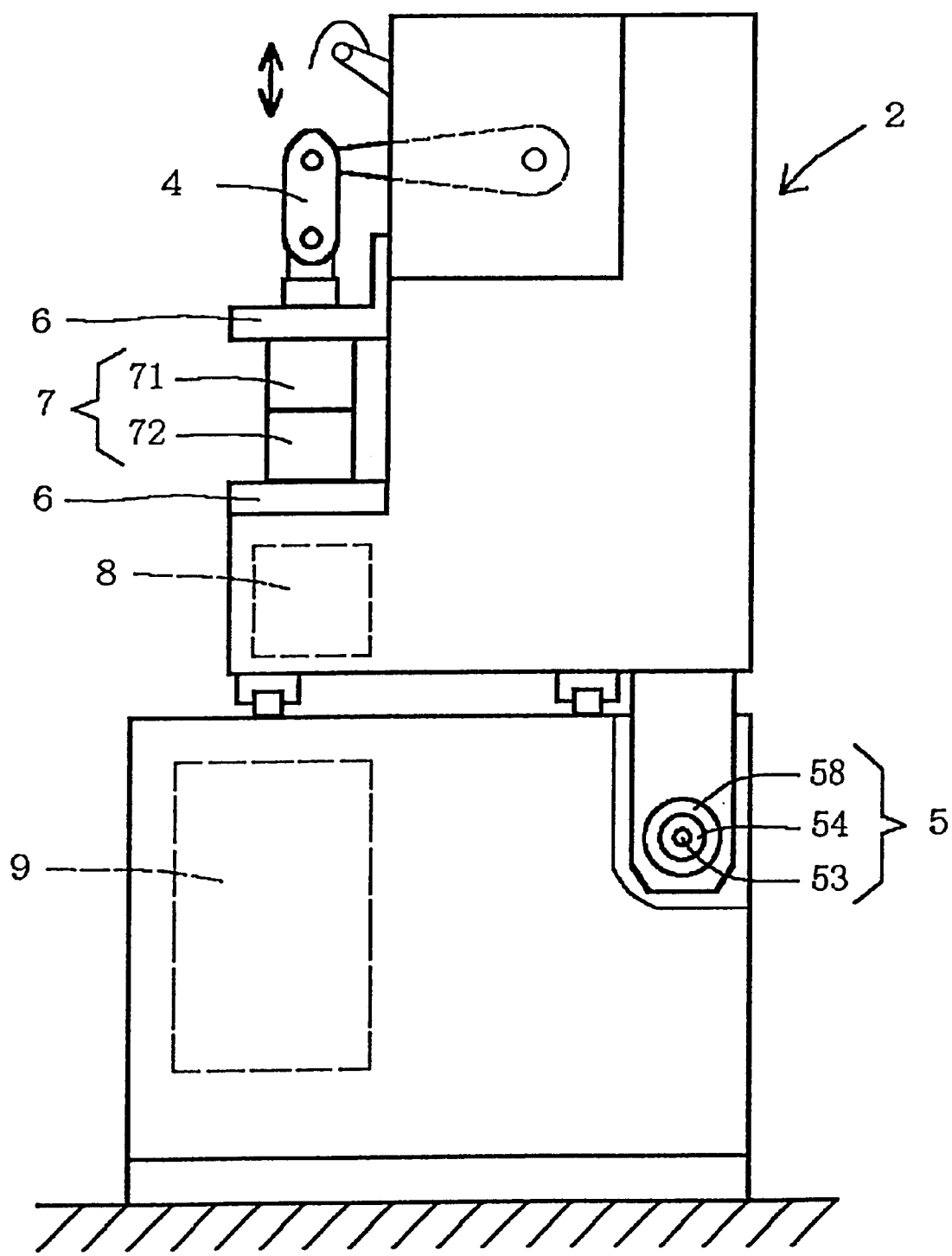
FIG. 1 is a schematic side view illustrating a basic structure of a leadframe processing apparatus according to one embodiment of the invention.

Processing presses 41 and 42 are each provided with mold fitting portions 6 formed with high precision on the upper front and lower front thereof as shown in FIG. 1. An upper mold 71 and a lower told 72 of a leadframe processing mold (mold for cutting or folding a leadframe) 7 are respectively attached to mold fitting portions 6. Accordingly, the apparatus has one mold per one press structure.

Mold fitting portions 6 are each formed with high precision, so that upper mold 71 and lower mold 72 can directly be attached to mold fitting portions 6 without inserting a conventional mold die set therebetween. Consequently, the whole shape of mold fitting portions 6 and their peripheral space can be decreased and accordingly the whole shape of processing presses 41 and 42 is made compact.

Lead processing unit 2 is further provided with a sucking discharge mechanism 8 for sucking wastes generated in the lead processing by processing mold 7 to automatically discharge them to the outside or to keep them in a processing waste holding portion. An automatic control mechanism 9 using control by a personal computer, inverter control and the like, for example, is further provided so as to adjust the degree of sucking (suction force or dust collection force) the processing wastes by sucking discharge mechanism 8.

In this way, an appropriate sucking operation is performed in the lead processing and accordingly, this structure enables prevention of curving deformation of a leadframe (L/F) due to excessive sucking operation as well as suction of generated processing wastes to efficiently and surely discharge them to the outside.

Figure 3:
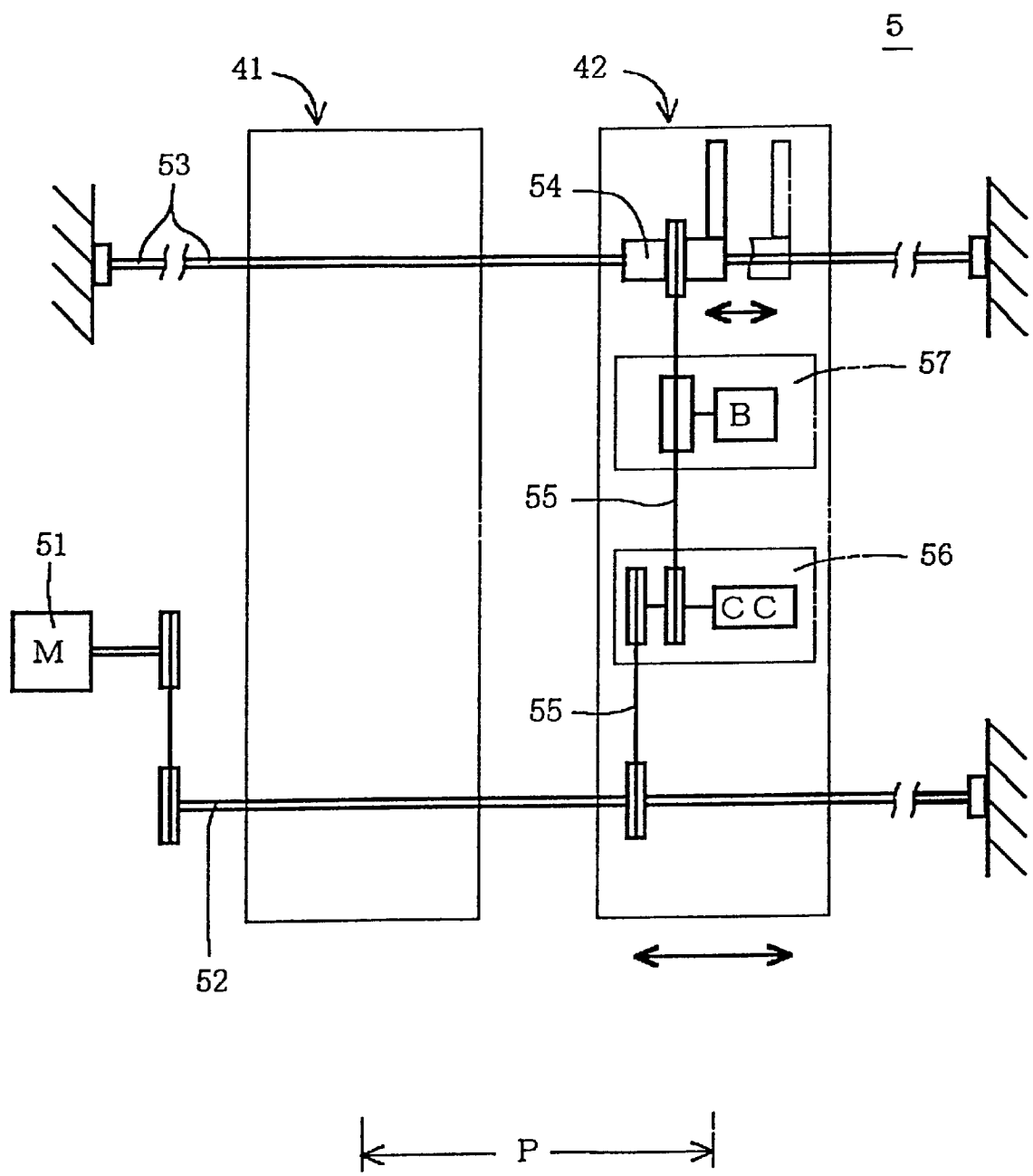
FIG. 3 illustrates a press pitch adjusting function of the leadframe processing apparatus associated with FIGS. 2A and 2B.

Referring to FIG. 3, press pitch adjusting mechanism 5 is constituted of a driving motor 51, a spline shaft 52 supported along the loading transport passage of a leadframe (L/F) and placed such that it is rotated by driving motor 51, a screw shaft 53 nonrotatably placed along the leadframe loading transport passage, a nut member 54 engaged with screw shaft 53, and power transmitting means 55 for transmitting rotational force of spline shaft 52 to nut member 54.

Along the passage through which the power is transmitted by power transmission means 55, a clutch 56 for transmitting the rotational force of spline shaft 52 to nut member 54 or blocking it, and a brake 57 for forcibly stopping rotation of nut member 54 are placed.

Processing presses 41 and 42 are coupled to nut member 54 engaged with screw shaft 53 via a bearing member 58 (see FIG. 1).

It is noted that an induction motor or servo motor can be used as driving motor 51 described above. If the induction motor is employed, usually a sensor for detecting the distance of movement is provided.

FIGS. 2A, 2B and 3 illustrate a structure in which two sets of processing presses 41 and 42 are arranged with one press 41 (on the front side) fixedly placed and only the other press 42 (on the rear side) movably placed for correction.

In order to establish a structure which allows one press 41 to move for correction as required, press 41 may be provided with nut member 54, power transmitting means 55, clutch 56 and brake 57 for forcibly stopping rotation of nut member 54 as described above.

Description is now given in conjunction with FIG. 3 regarding correctional shifting of the two sets of processing presses 41 and 42 with the structure shown in FIG. 2. The correction is made to the press pitch P between the presses according to work pitch P1 between works on a leadframe.

Driving motor 51 is first actuated to rotate spline shaft 52 and then the rotational force is transmitted to nut member 54 via power transmitting means 55 to rotate nut member 54.

Nut member 54 is then shifted in the direction in which screw shaft 53 is placed (leadframe loading transport direction) since screw shaft 53 is nonrotatably placed. At this time, processing press 42 integrally coupled to nut member 54 is shifted simultaneously with nut member 54.

Accordingly, in order to correct press pitch P of the two sets of processing presses 41 and 42 according to the work pitch of the leadframe, nut member 54 may be rotated to appropriately shift it in the direction of screw shaft 53 such that press pitch P corresponds to the work pitch.

As discussed above, processing press 42 is shifted to and automatically stopped at a predetermined position by automatic control. However, the above-mentioned sensor may be used to detect the position to which the press is shifted and accordingly stop the press at this position.

Figure 4A:
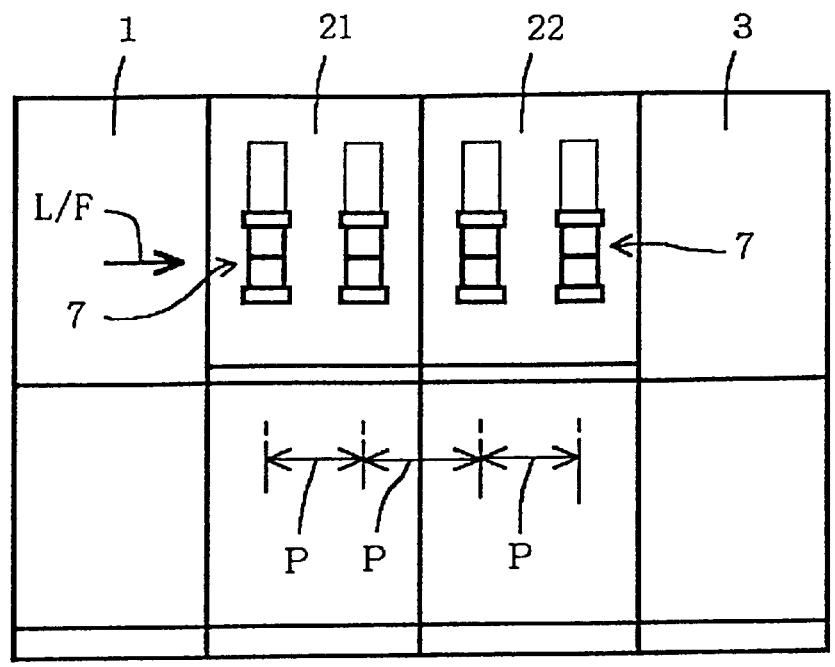
FIG. 4A is a schematic front view of a leadframe processing apparatus according to another embodiment of the invention and FIG. 4B is a schematic plan view thereof, illustrating four sets of processing presses placed at a lead processing unit.
Figure 4B:
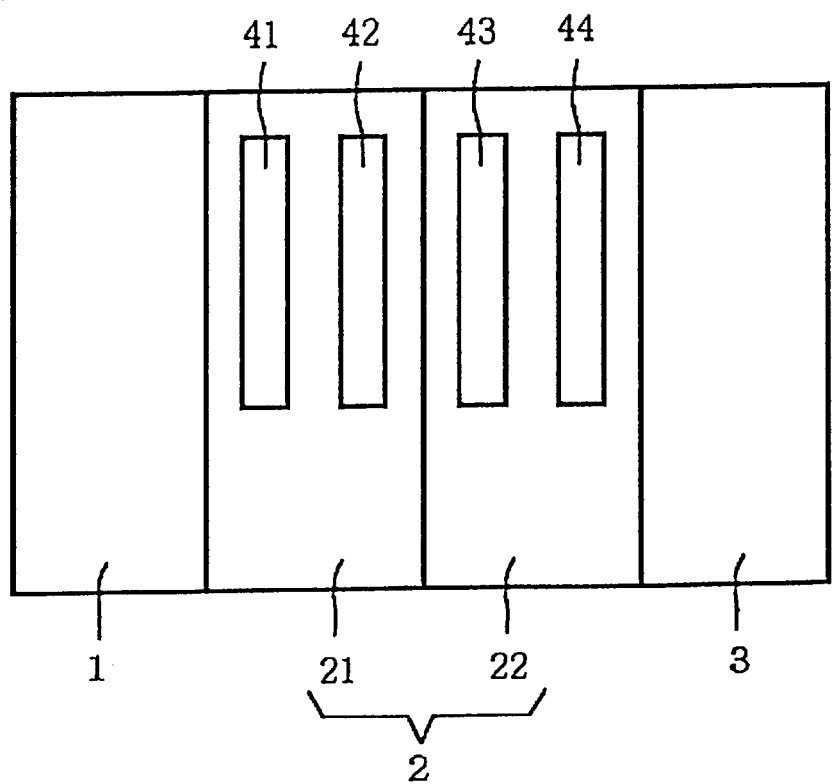

FIGS. 4A and 4B illustrate a structure in which two lead processing main bodies 21 and 22 each having two sets of processing presses are detachably coupled to each other in lead processing unit 2. In other words, a total of four sets of processing presses 41, 42, 43 and 44 are placed at or on two lead processing main bodies 21 and 22.

The basic structure of the leadframe processing apparatus illustrated in FIGS. 4A and 4B is substantially identical to that of the leadframe processing apparatus shown in FIGS. 2A and 2B except that the number of processing presses is different and two lead processing main bodies 21 and 22 are detachably coupled. Therefore, substantially identical components have the same reference character and description thereof is not repeated here.

The structure having two detachably coupled lead processing main bodies each having two sets of processing presses is advantageous in that the number of lead processing main bodies is appropriately increased or decreased depending on increase or decrease of the number of processing steps.

On the other hand, if adjustment is unnecessary of the number of the lead processing main bodies depending on increase or decrease of the processing steps, a required number of sets of presses may be provided in one lead processing main body. An advantage in this case is that spline shaft 52 and screw shaft 53 can be shared as shown in FIG. 5.

Figure 5:
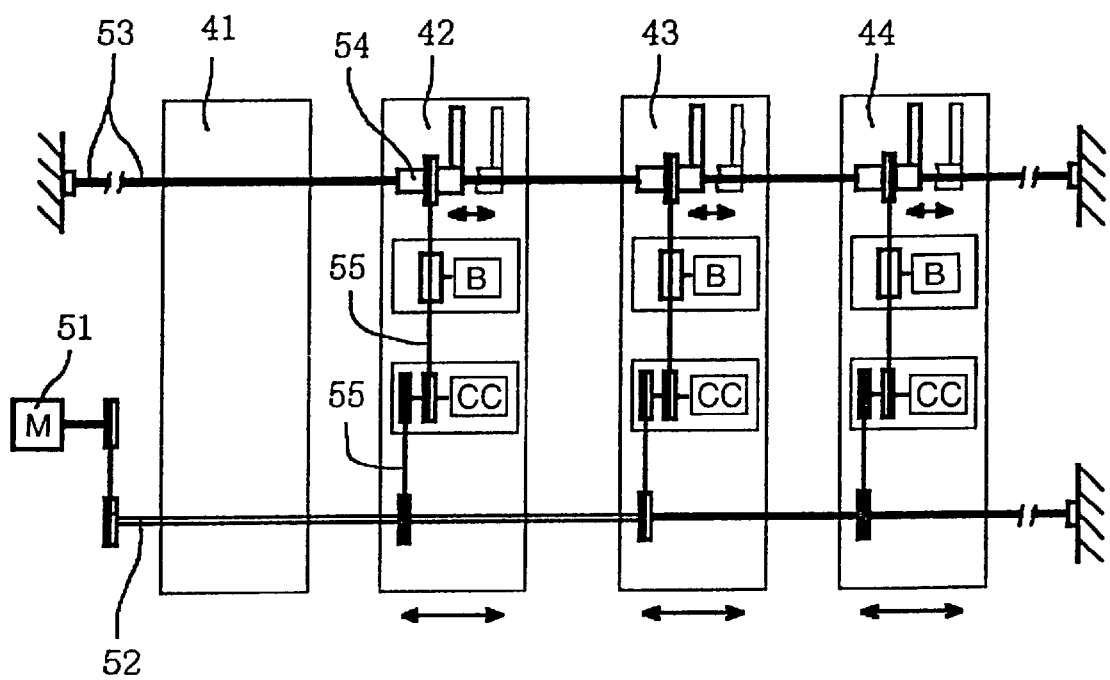
FIG. 5 illustrates a press pitch adjusting function of the leadframe processing apparatus associated with FIGS. 4A and 4B.

Description is next given in conjunction with FIG. 5 regarding a correctional shifting operation of the four sets of processing presses 41, 42, 43 and 44 shown in FIG. 4B to correct press pitch P according to the work pitch of a leadframe.

FIG. 5 schematically shows a structure in which processing press 41 on the front end is fixed and only the following processing presses 42, 43 and 44 on the rear side can be shifted individually for correction as the structure of the leadframe processing apparatus shown in FIGS. 2A and 2B.

Referring to FIG. 5, driving motor 51 is first actuated to rotate spline shaft 52, and the rotational force is transmitted to nut member 54 via power transmitting means 55 to rotate nut member 54.

Nut member 54 engaged with nonrotatably placed screw shaft 53 is accordingly shifted in the direction in which screw shaft 53 is placed. At this time, processing press 42 integrally coupled to nut member 54 is accordingly shifted simultaneously with the shift of nut member 54.

The correctional shifting operation of nut member 54 (processing press 42) is similarly effected for processing presses 43 and 44 on the rear side.

If processing presses 43 and 44 on the rear side are shifted for correction, clutch 56 and/or brake 57 provided along the passage through which power is transmitted by power transmitting means 55 are/is preferably actuated so as to prevent displacement of processing press 42 which has already been shifted for correction.

Accordingly, processing press 42 is shifted to a predetermined position by, for example, the correctional shifting operation as described above and surely fixed at this position, then the next processing press 43 is shifted to and fixed surely at a predetermined position, and then the remaining processing press 44 is similarly shifted to and fixed surely at a predetermined position. Consequently, press pitch P of four sets of processing presses 41, 42, 43 and 44 can be corrected according to the work pitch of a leadframe.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of processing a leadframe comprising the steps of:

transporting a leadframe to load said leadframe to a lead processing unit having a plurality of sets of processing presses;

adjusting a press pitch of said plurality of sets of processing presses according to a work pitch of works on said leadframe by rotating a nut member that is engaged on a non-rotating screw shaft extending in a direction of said transporting of said leadframe, and that is coupled to at least one of said processing presses, so that said nut member moves along said screw shaft and said at least one of said processing presses moves with said nut member; and performing a predetermined lead processing on said leadframe by said plurality of sets of processing presses after said step of adjusting said press pitch.

2. The method of processing a leadframe according to claim 1, further comprising a step of directly attaching a mold for processing a leadframe to a fitting portion provided to said processing presses before performing said lead processing.

3. The method of processing a leadframe according to claim 1, further comprising a step of sucking and discharging processing wastes in said lead processing unit by a sucking discharge mechanism for the processing wastes provided to said lead processing unit with automatic control of degree of sucking the processing wastes.

4. The method of processing a leadframe according to claim 1, further comprising a step of detachably coupling a plurality of lead processing main bodies which constitute said lead processing unit before said step of transporting said leadframe to load said leadframe.

5. The method of processing a leadframe according to claim 1, wherein said processing presses include a first processing press and at least one subsequent processing press arranged in sequence after said first processing press in said direction of said transporting of said leadframe, wherein said nut member is coupled to one of said at least one subsequent processing press, and wherein said step of adjusting said press pitch comprises moving said one of said at least one subsequent processing press by rotating said nut member while maintaining said first processing press stationarily fixed in said lead processing unit.

6. The method of processing a leadframe according to claim 1, wherein said processing presses include a first processing press and at least one subsequent processing press arranged in sequence after said first processing press in said direction of said transporting of said leadframe, wherein said nut member is coupled to said first processing press, and wherein said step of adjusting said press pitch comprises moving said first processing press by rotating said nut member.

7. The method of processing a leadframe according to claim 6, wherein said step of adjusting said press pitch further comprises moving said at least one subsequent processing press.

\* \* \* \* \*